(12) United States Patent
Gruen et al.

(10) Patent No.: US 7,202,544 B2
(45) Date of Patent: Apr. 10, 2007

(54) GIANT MAGNETORESISTANCE STRUCTURE

(75) Inventors: Detlef Gruen, Reutlingen (DE); Frank Fischer, Gomaringen (DE); Henrik Siegle, Leonberg (DE); Peter Hein, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/470,956

(22) PCT Filed: Jan. 25, 2002

(86) PCT No.: PCT/DE02/00243

§ 371 (c)(1),
(2), (4) Date: Jan. 26, 2004

(87) PCT Pub. No.: WO02/061446

PCT Pub. Date: Aug. 8, 2002

(65) Prior Publication Data

US 2004/0115922 A1   Jun. 17, 2004

(30) Foreign Application Priority Data

Jan. 30, 2001   (DE)   ................................ 101 03 868

(51) Int. Cl.
*H01L 31/00*   (2006.01)
(52) U.S. Cl. .................... 257/444; 257/414; 257/423; 257/E27.103
(58) Field of Classification Search ................. 257/444, 257/226, 234, 254, 414–417; 438/48, 51–54
See application file for complete search history.

(56) References Cited

U.S. PATENT DOCUMENTS

| 5,306,573 | A |   | 4/1994  | Piirot et al.          |
|-----------|---|---|---------|------------------------|
| 5,419,806 | A | * | 5/1995  | Huebner ........ 216/20 |
| 5,650,958 | A |   | 7/1997  | Gallagher et al.       |
| 6,156,656 | A | * | 12/2000 | Kobayashi et al. ... 438/687 |
| 6,445,003 | B1| * | 9/2002  | Chang et al. ....... 257/59 |

FOREIGN PATENT DOCUMENTS

DE   43 14 539   11/1994

(Continued)

OTHER PUBLICATIONS

Ross, M., "GMR: An Attractive Resistance" Europhysics News, Berlin, Germany, Jul. 1997, pp. 114-118.

(Continued)

*Primary Examiner*—Dung A. Le
(74) *Attorney, Agent, or Firm*—Kenyon & Kenyon LLP (57) ABSTRACT

The present invention relates to a method for producing a GMR structure in which a metallic multiple layer is applied onto a carrier and in which the metallic multiple layer is patterned to produce the GMR structure, the carrier having a structure before the metallic multiple layer is applied and the patterning of the metallic multiple layer is performed by CMP. The present invention also relates to a GMR structure having a carrier and a patterned metallic multiple layer positioned on the carrier, the patterned metallic multiple layer being situated in one or more depressions of the carrier. In addition, the present invention relates to a use of GMR structures.

2 Claims, 6 Drawing Sheets

FOREIGN PATENT DOCUMENTS

| | | |
|---|---|---|
| EP | 0 727 773 | 8/1996 |
| JP | 62-043811 | 2/1987 |
| JP | 9-219546 | 8/1997 |
| WO | WO 00/38191 | 6/2000 |
| WO | WO 00/52701 | 9/2000 |

OTHER PUBLICATIONS

H. Boeve et al. "integration of spin valves and GaAs diodes in magnetorsistive random access memory cells", 1999, Proceedings of the 43rd annual Conference On Magnetism And Magnet materials, Journal of Applied Physics, vol. 85, No. 8, part 2, 1999, pp. 4779-4781.

Y.Z. Hu et al., "Chemical-mechanical polishing as an enabling technology for giant magnetoresistance devices", Thin Solid Films, 308-309, 1997, pp. 555-561.

E. Hufgardt et al. "GMR-Sensoren fur kontaklose Positionmessungen" Electronik Information, No. 10-1997, pp. 86-87, (English abstract).

* cited by examiner

Fig.20

GIANT MAGNETORESISTANCE STRUCTURE

This application is a 371 of PCT/DE02/00243 Jan. 25, 2002

FIELD OF THE INVENTION

The present invention relates to a method for producing a GMR structure ("giant magnetoresistance structure") in which a metallic multiple layer is deposited on a carrier, and in which the metallic multiple layer is patterned to produce the GMR structure. The present invention also relates to a GMR structure having a carrier and a patterned metallic multiple layer positioned on the carrier.

BACKGROUND INFORMATION

Displacement sensors and angular displacement sensors which work on a magnetic basis find numerous applications, for example, in motor vehicle technology. Particular advantages are that the sensors work without making contact, and therefore without mechanical wear. They are ruggedly resistant to soiling, and they withstand high temperatures. Conventional magnetic sensors are based, for instance, upon the Hall effect or an AMR effect ("anisotropic magnetoresistance effect").

Recently, new sensor concepts have been used for the "position sensing systems" used, which employ the giant magnetoresistance effect or GMR effect. This effect is based on the principle that electrons, because of their quantized spin states, are scattered with different force as they pass through magnetic layers, depending on the alignment of the magnetization of these layers. In response to parallel magnetization, the scattering is less than in response to magnetization that is applied in antiparallel fashion. This leads to a change in electrical resistance as a function of the external magnetic field, in which there is a GMR structure. The meaning this has for the position sensor system comes about due to the fact that an external magnetic field is influenced by a magnetic element, such as perhaps a rotor or even an element moving in a straight line, this influence showing up in the resistance of the GMR structure.

High requirements should be set for the measurement of the resistances of the layer systems, since the resistance is the decisive variable from which to draw a conclusion on the magnetic field to be measured. Particularly accurate measuring methods are based on the conventional Wheatstone bridge circuit. Such a Wheatstone bridge circuit may, for example, have four GMR elements.

Conventional methods for producing GMR elements are based on the depositing of magnetic and nonmagnetic multiple layers on an insulating subsurface. After the depositing of the metal, there takes place the patterning of the metal plane, typically using a dry etching process. Available as such a dry etching process are, for example, ion beam etching (BE), an RF sputtering method, or the lift-off technique. Subsequently, the electrical contacts are mounted on the GMR element. Thereafter, passivating layers are deposited.

FIGS. 1 through 7 illustrate a method of the related art for producing a GMR structure. In each case, intermediate states during the course of the method are shown in sectional representation by a layer system.

Figure 1:
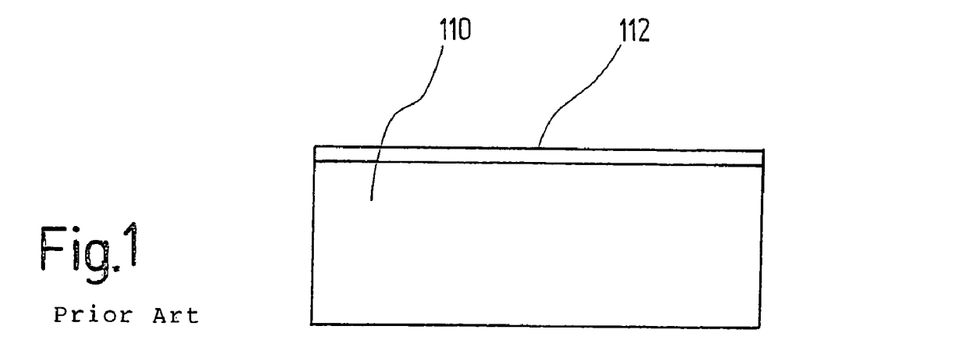
FIG. 1 shows a first state during a production method of a GMR structure of the related art.

FIG. 1 shows a semiconductor substrate 110, silicon, for example, having an insulating layer 112 lying above it.

Figure 2:
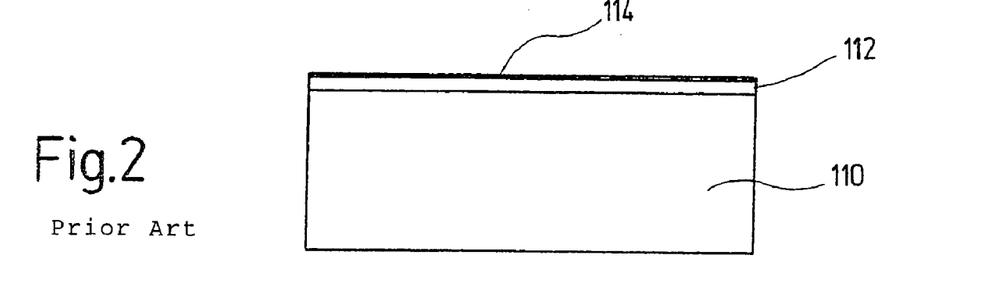
FIG. 2 shows a second state during a production method of a GMR structure of the related art.

FIG. 2 shows the system according to FIG. 1 having a metallic multiple layer 114 additionally applied to insulating layer 112. This metallic multiple layer 114, which according to its later function may also be denoted as a GMR layer, is applied, for example, by a deposition process. For this, one may, for instance, use a DC magnetron sputter process. The GMR layer is made, for example, of Co/Cu or FeCr/Cu layers. It typically has an overall thickness of 100 nm.

Figure 3:
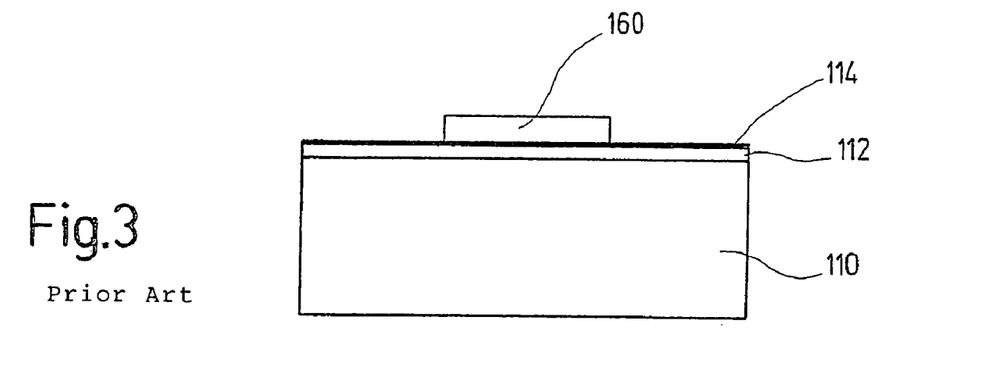
FIG. 3 shows a third state during a production method of a GMR structure of the related art.

FIG. 3 shows the layer system according to FIG. 2 having a resist mask 160 additionally applied to it by photolithography on metallic multiple layer 114. This resist mask 160 is used for the patterning of the GMR layer.

Figure 4:
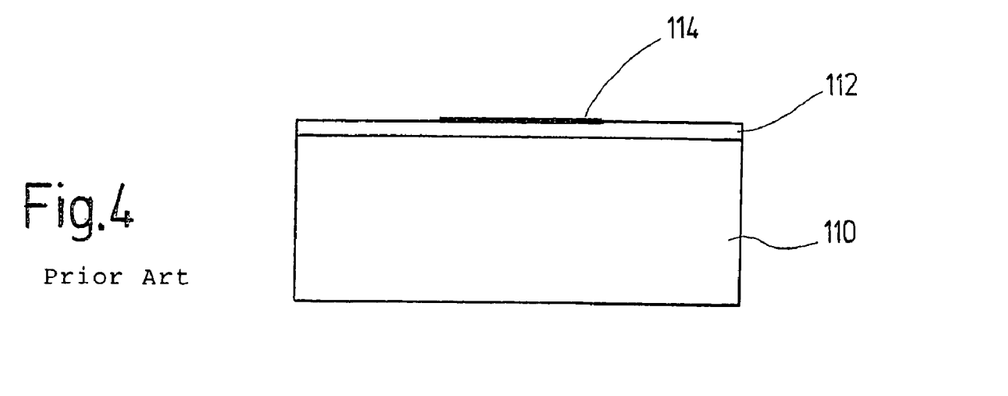
FIG. 4 shows a fourth state during a production method of a GMR structure of the related art.

FIG. 4 shows a state which builds on the state according to FIG. 3, and in which GMR layer 114 has already been patterned. This may have been done, for example, by dry etching, perhaps using BE. Resist mask 160 was further removed according to FIG. 3.

Figure 5:
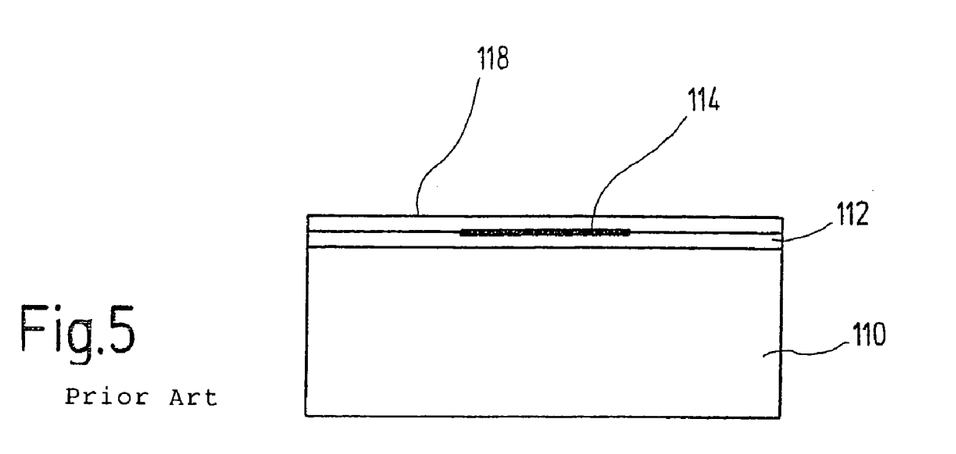
FIG. 5 shows a fifth state during a production method of a GMR structure of the related art.

Now, according to FIG. 5, a passivating layer 118 is deposited in addition on the system according to FIG. 4. This may be made, for instance, of silicon dioxide, silicon nitride and comparable materials.

Figure 6:
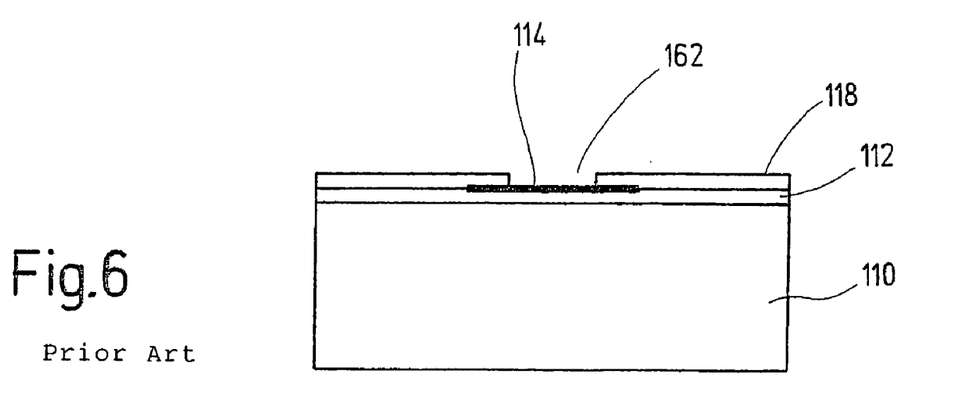
FIG. 6 shows a sixth state during a production method of a GMR structure of the related art.

FIG. 6 shows a state which builds up on FIG. 5. In the layer system shown here, passivating layer 118 is patterned, so that a contact hole 162 is created.

Figure 7:
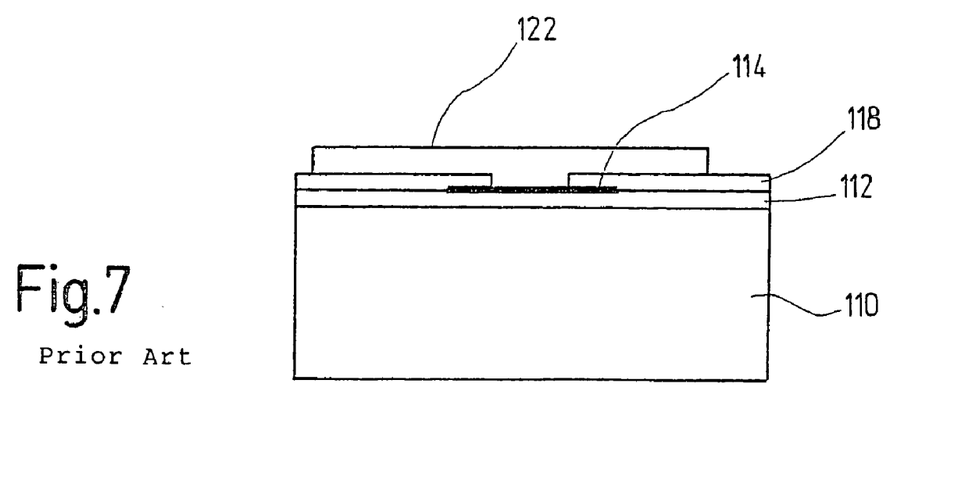
FIG. 7 shows a seventh state during a production method of a GMR structure of the related art.

FIG. 7 then shows a state which comes about from the state according to FIG. 6, in which a contact metal 122 is deposited. This contact metal 122 produces an electrical contact with GMR layer 114 via contact opening 162.

If one now wants to integrate on one chip the GMR element and the evaluation electronics required for the evaluation of the magnetoresistances, certain matters ought to be observed in using the production process shown. For example, in the metal plane, i.e. in multiple layer 114 according to FIG. 2, materials are used which cannot be used in the vicinity of a CMOS structure for contamination reasons. Therefore one must take care in the process sequence to have a sequential production first of the CMOS structure and only then of the GMR element. In this context, it is a particular disadvantage that lithography planes are required in the metal-contaminated part of the process sequence, as was explained in the light of FIG. 3 and FIG. 4.

SUMMARY

In accordance with the present invention, the carrier has a structure before the application of the metallic multiple layer, and the patterning of the metallic multiple layer is performed by "chemical mechanical polishing" (CMP). The structure of the GMR layers, for example a typical meander structure, is therefore already predetermined before the application of the metallic multiple layer, at least partially by the patterning of the substrate or the insulating layer situated on the substrate, such as $SiO_2$. After the large-surface depositing of the metallic multiple layer, the metal layers are removed again by CMP. However, in the depressions, the GMR structures are not removed. Patterning the GMR layer by lithography and a cost-intensive dry etching method may therefore be dispensed with.

In one example embodiment, the patterned carrier be produced by patterning of a semiconductor substrate and subsequent depositing of an insulating layer. The depressions, which in the final analysis determine the GMR structure, may consequently be applied to a silicon substrate, for example, by a dry etching method. The structure is then maintained, after the depositing of an insulating layer, for example on the basis of a thermal oxide of 0.5 to 1.5 µm in thickness.

It may be of advantage if, before the patterning of the metallic multiple layer by CMP, a passivating layer is deposited. The GMR layer is protected in this manner during the subsequent process steps.

However, it may also be useful to deposit a passivating layer after and/or before patterning the metallic multiple layer by CMP. This passivating layer may be the first passivating layer deposited during the process. However, it may also be useful to deposit this passivating layer if a passivating layer was deposited already before the patterning of the metallic multiple layer. In the first case, i.e., the passivating layer deposited after the patterning of the metallic multiple layer is the first passivating layer, the passivating layer covers the already patterned GMR layer. In the case in which, before the patterning of the metallic multiple layer, a passivating layer had already been deposited, the passivating layer deposited after the patterning of the metallic multiple layer is used to cover the open sides of the GMR layer.

The example method according to the present invention may be especially advantageously further refined in that the passivating layer deposited after the patterning of the metallic multiple layer by CMP is patterned, and that subsequently a contact metal is deposited. In this way an electrical connection is made possible of the GMR structure to other components.

In this connection, it may be advantageous if the patterning of the semiconductor substrate takes place within the scope of the patterning of an integrated circuit on the same semiconductor substrate. Consequently, the definition of the GMR structure may be used within the scope of the patterning of the semiconductor substrates for integrated circuits, for example, for CMOS structures as a component of the evaluation circuit of the GMR structures.

The method may be further refined particularly advantageously in that the metallic multiple layer is applied to a first region in which the GMR structure is to be produced, and in that the metallic multiple layer is applied to a second region in which structures are present for an integrated circuit. Since the metallic multiple layer is removed in regions outside the depressions provided for the GMR structure by chemical-mechanical polishing, it is possible to apply the metallic multiple layer nonspecifically to the entire surface of a wafer. This makes masking steps unnecessary.

A further advantageous embodiment of the method is that, before the depositing of the insulating layer, a further insulating layer is applied, that to this further insulating layer a layer is applied which makes available at least one conducting connection between the first region and the second region, and that after the depositing of the insulating layer the insulating layer in the first region is patterned, so that the subsequently applied metallic multiple layer has an electrical contact to the at least one electrical connection. In this way, in one efficient process an electrical connection is established between, for example, a CMOS structure and the GMR structure. The conducting connection between the GMR structure and the CMOS structure then lies below the GMR structure.

The method may be further refined in a particularly advantageous manner if the insulating layer is applied to a first region in which the GMR structure is to be produced, and in that the metallic multiple layer is applied to a second region in which structures are present for an integrated circuit, and in that the insulating layer acts as a passivating layer in the second region. Thus, in the first region the insulating layer is the carrier for the GMR structure. In the second region the insulating layer covers the CMOS structure as a passivating layer.

In accordance with example embodiments of the present invention, the patterned metallic multiple layer may be situated in one or several depressions of the carrier. Because of the positioning of the patterned multiple layer in depressions, it is possible to produce the patterning of the multiple layer by chemical-mechanical polishing. Consequently, it is not necessary to use costly patterning methods.

Preferably, the carrier includes a semiconductor substrate and an insulating layer. Therefore, the depression may be applied to the carrier in such a way that first a depression is applied to the semiconductor substrate, and then an insulating layer is applied onto the semiconductor substrate.

Preferably, at least one passivating layer is positioned on the patterned multiple layer. The patterned multiple layer is protected in this manner during the production process.

In one advantageous manner, the GMR structure may be further refined in that an integrated circuit is provided on the semiconductor substrate, in that, between the integrated circuit and the metallic multiple layer there is at least one conducting connection which is situated below the metallic multiple layer, and in that the contacting of the metallic multiple layer with the conducting connection is implemented by an opening in an insulating layer. In this manner it is possible, for example, to implement an evaluation circuit and the GMR structure on the same semiconductor substrate, it being also possible to integrate process steps, such as applying primary structures onto the silicon substrate either for the preparation of the integrated circuit or for the preparation of the GMR structure.

The present invention may further include using one of the GMR structures described, or in a GMR structure which was produced according to one of the methods described, as a displacement sensor and/or as an angular position sensor. Therewith the present invention develops its special advantages, for example, in motor vehicle technology. The GMR structures, having great effectiveness and high sensitivities, bid fair to be able to implement great working distances and compact dimensions at low power consumption and great stability to temperature.

The present invention is based on the surprising realization that a technological process is made available in which the GMR metal layer is covered almost completely by passivating layers, during the entire production process. In this way there is a low risk of cross contamination by metals. It is especially advantageous that in preferred embodiments, the lithography steps for processing the wafers may be pushed into the CMOS part of the process, whereby lower investments accrue in specially proven equipment. CMP devices are used for the patterning of the GMR plane. These are substantially more cost-effective than maintenance-intensive BE equipment.

BRIEF DESCRIPTION OF THE DRAWINGS

The present invention is now elucidated with reference to preferred exemplary embodiments with reference to the accompanying drawings.

DESCRIPTION OF EXAMPLE EMBODIMENTS

Figure 8:
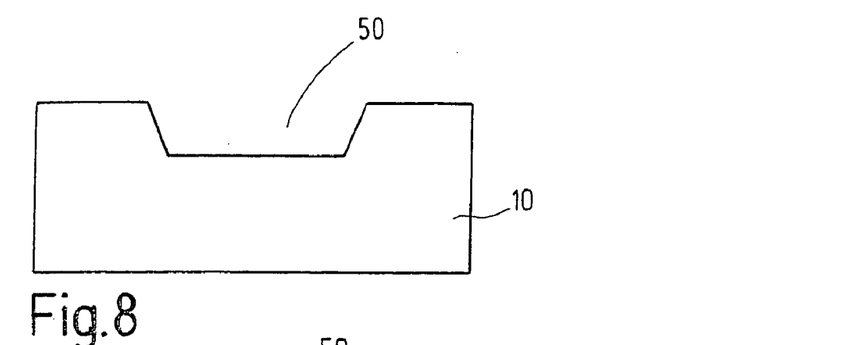
FIG. 8 shows a first state during a production method of a GMR structure according to the present invention.

FIG. 8 shows a semiconductor substrate, such as a silicon substrate 10, which has a depression 50. This depression 50 was, for example, introduced into silicon substrate 10 using a dry etching method.

Figure 9:
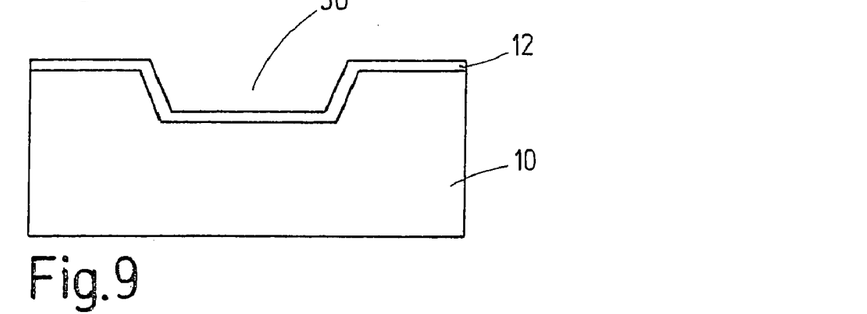
FIG. 9 shows a second state during a production method of a GMR structure according to the present invention.

FIG. 9 builds up on the structure according to FIG. 8, an insulating layer 12 being applied to silicon substrate 10. This insulating layer 12 is made, for example, of a thermal oxide having a thickness of 0.5 to 1.5 µm.

Figure 10:
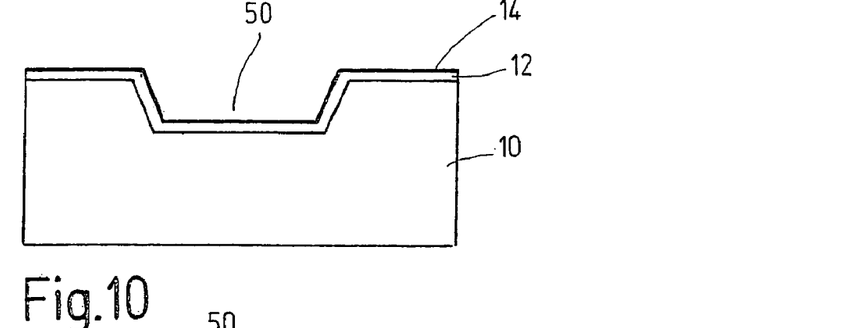
FIG. 10 shows a third state during a production method of a GMR structure according to the present invention.

FIG. 10 shows a layer arrangement which builds up on the layer arrangement according to FIG. 9. In addition, a metallic multiple layer 14, i.e., a GMR layer has been applied over the whole surface onto insulating layer 14. Depression 50, which was originally created by the patterning of silicon substrate 10, is still there.

Figure 11:
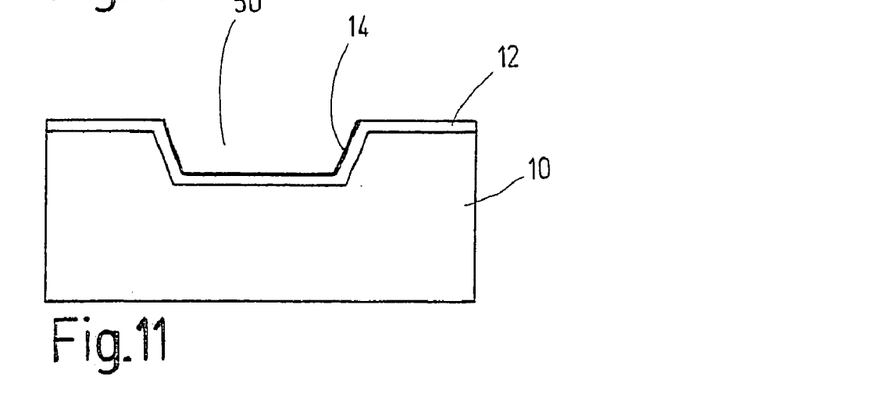
FIG. 11 shows a fourth state during a production method of a GMR structure according to the present invention.

FIG. 11 shows a layer arrangement which has been created by further processing of the layer arrangement according to FIG. 10. In this further processing, the projecting metal surfaces, i.e., the metal surfaces outside depression 50, have been removed by chemical-mechanical polishing (CMP). To do this, for example, metal-selective CMP or silicon-selective CMP come into consideration.

Figure 12:
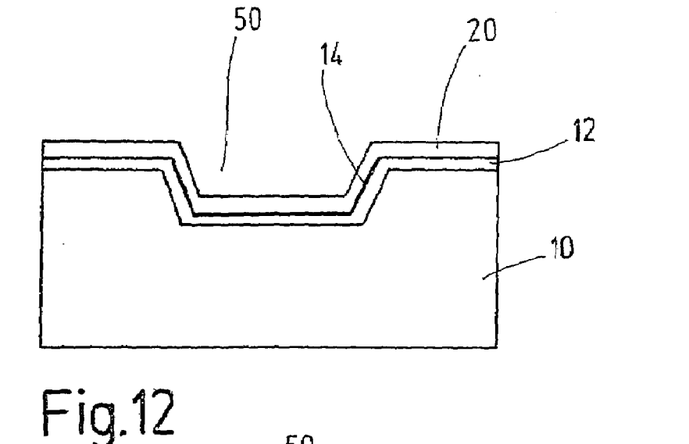
FIG. 12 shows a fifth state during a production method of a GMR structure according to the present invention.

FIG. 12 shows a state which was created by depositing a passivating layer 20 onto the structure according to FIG. 11.

Figure 13:
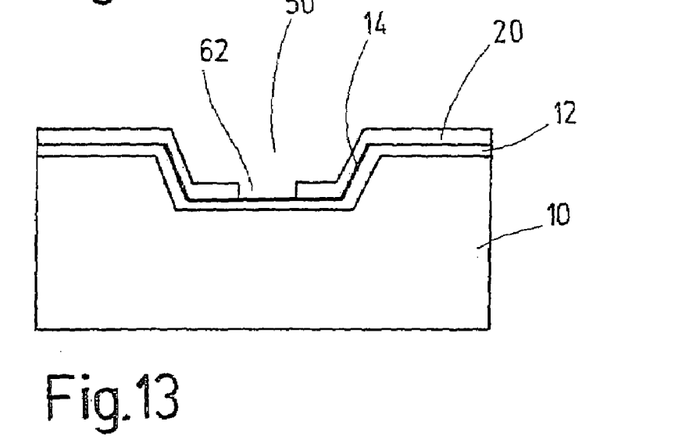
FIG. 13 shows a sixth state during a production method of a GMR structure according to the present invention.

FIG. 13 shows a state in which passivating layer 20, which is still cohesive in FIG. 12, has been furnished with an interruption 62. In this way, the surface of GMR structure 14 is partially exposed.

Figure 14:
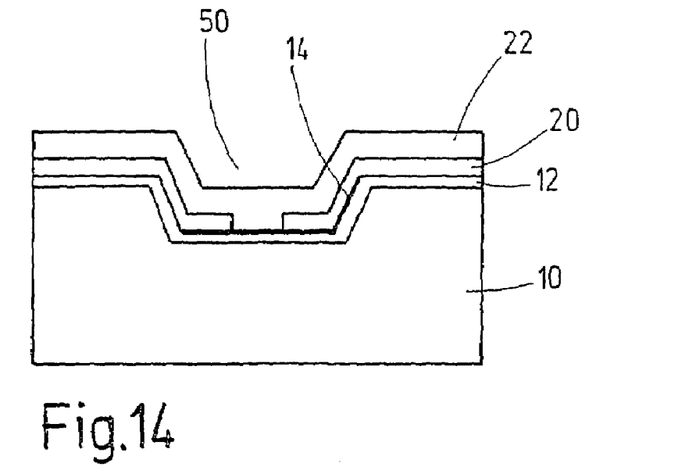
FIG. 14 shows a seventh state during a production method of a GMR structure according to the present invention.

FIG. 14 shows a state in which an electrical contact to the GMR layer has been established. For this purpose, a contact metal 22 has been deposited onto the system according to FIG. 13. This produces an electrical connection to GMR structure 14, mediated by depression 62.

Figure 15:
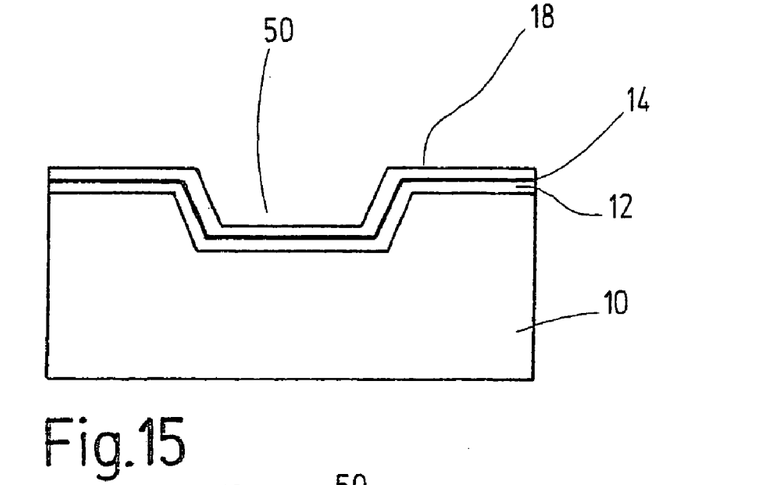
FIG. 15 shows a fourth state during a production method of a GMR structure according to a further example embodiment of the present invention.
Figure 16:
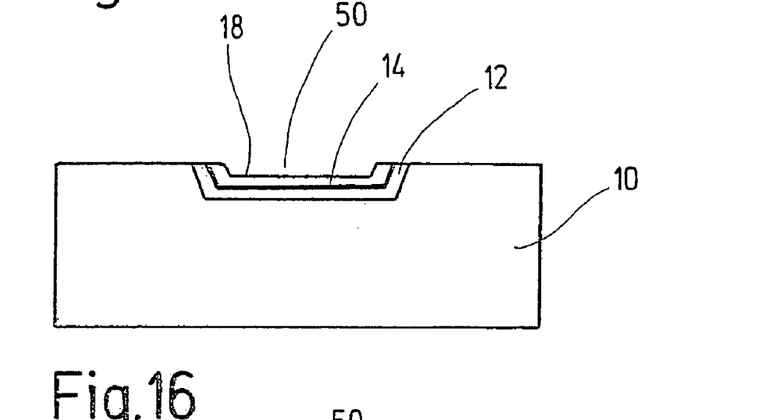
FIG. 16 shows a fifth state during a production method of a GMR structure according to a further example embodiment of the present invention.
Figure 17:
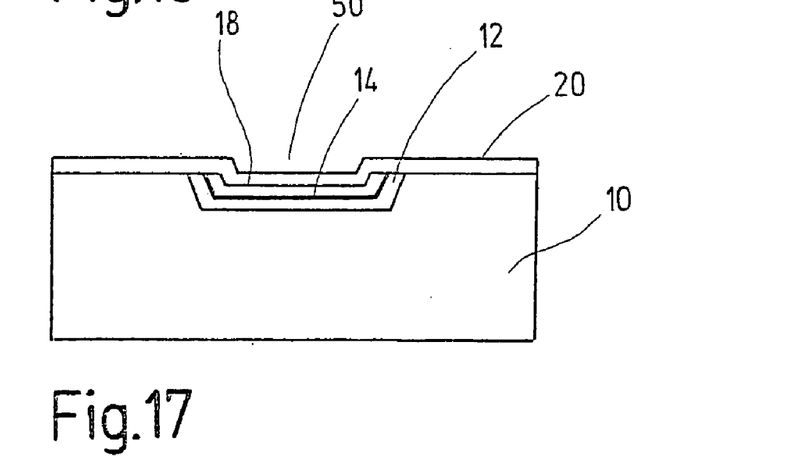
FIG. 17 shows a sixth state during a production method of a GMR structure according to a further example embodiment of the present invention.

FIG. 15 shows the result of a method step which builds up on the state according to FIG. 10. FIGS. 15 through 17 consequently show a part of a variant of the method described in the light of FIGS. 8 through 14. A passivating layer 18 is deposited on the layer arrangement according to FIG. 10, so that GMR layer 14 is covered and protected practically during the entire method by the passivating layer. As passivating layer 18, a low-temperature PECVD oxide is used, for example.

FIG. 16 shows the final state of a method step which starts from the state according to FIG. 15. In this method step, a planarization was carried out by a CMP method, for example, by an oxide CMP method.

FIG. 17 shows the final state of a method step which builds up on the state according to FIG. 16. A passivating layer 20 has been deposited over the entire structure shown in FIG. 16. It is used for passivating the sides of GMR layer 14 that are still exposed in FIG. 16. This step according to FIG. 17 is optional.

Starting from the states in FIG. 16 or FIG. 17, the method step may be executed that were described with reference to FIG. 13, that is, the patterning of passivating layers 18 or 18 and 20 as well as the application of a contact metal 22.

Figure 18:
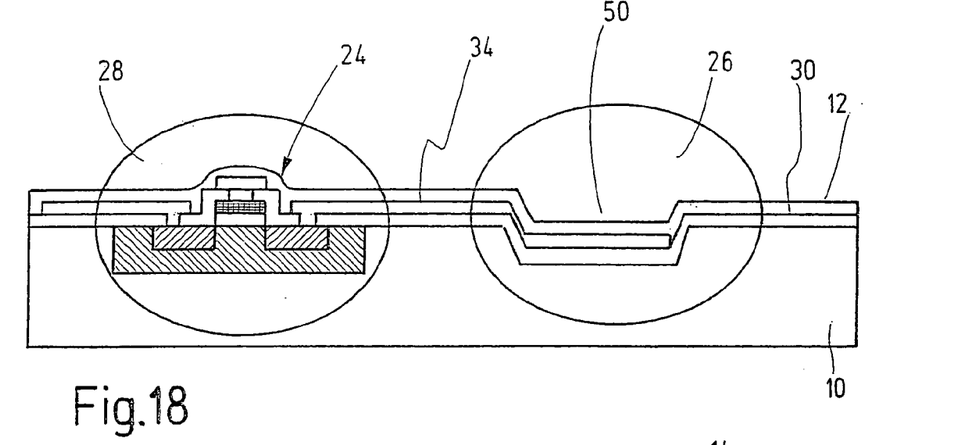
FIG. 18 shows a semiconductor substrate having regions for a GMR structure and an integrated circuit in a first processing state.

FIG. 18 shows a sectional representation through a layer system. Two regions 26, 28 are circled. In region 26 a depression 50 has been provided which represents the pre-patterning for the later GMR structure. In region 28 there are already patternings for integrated circuits 24. Between first region 26 and second region 28 a conducting connection 34 has been provided. First region 26 has a layer sequence made up of semiconductor substrate 10, a lower oxide layer 30, conducting layer 50 and an upper oxide layer 12. The upper oxide layer 12 covers the entire system, i.e., even the components in region 28. In region 28, oxide layer 12 acts as a passivating layer.

Figure 19:
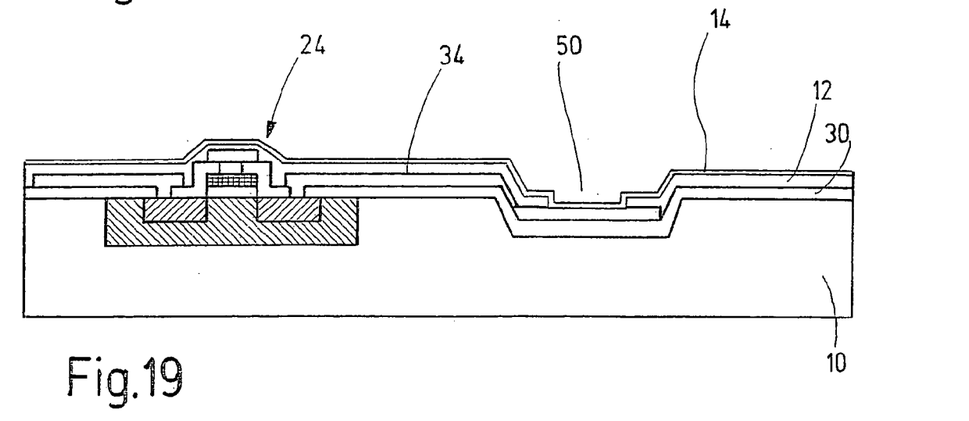
FIG. 19 shows a semiconductor substrate having regions for a GMR structure and an integrated circuit in a second processing state.
Figure 20:
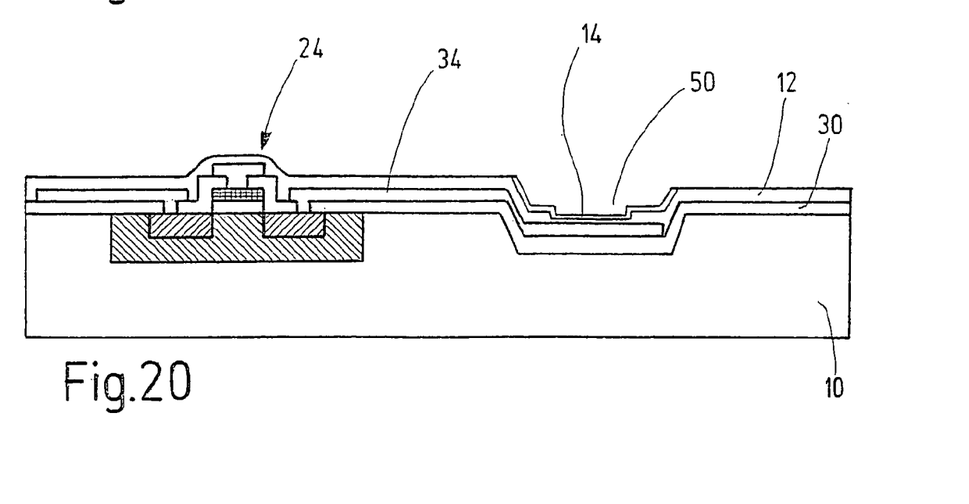
FIG. 20 shows a semiconductor substrate having regions for a GMR structure and an integrated circuit in a third processing state.

In FIG. 19 a state is shown which results from a processing of the structure as in FIG. 18. First, a gap was made in upper oxide layer 12, near depression 50 in first region 26. Then, a metallic multiple layer 14 was applied with its full surface over the surface shown. Because of the interruption (gap) in upper oxide layer 12, this contacts conducting connection 34. Consequently, the metallic multiple layer is electrically connected to integrated circuit 24 in second region 28. After that, the metallic multiple layer is partially removed by chemical-mechanical polishing (CMP). Only in depression 50 does the metallic multiple layer remain as GMR structure 14. Thus, GMR structure 14 is directly connected in a conducting manner to integrated circuit 24. Integrated circuit 24 may be, for example, an evaluation circuit for the GMR structure.

The preceding description of the exemplary embodiments according to the present invention serves only for illustrative purposes, and not for the purpose of limiting the invention. Various changes and modifications are possible within the framework of the present invention without going beyond the scope of the present invention or its equivalents.

What is claimed is:

1. A giant magnetoresistance structure, comprising:
   a semiconductor substrate forming a carrier;
   an insulating layer situated on the carrier;
   a patterned metallic multiple layer situated on the insulating layer, wherein the patterned metallic multiple layer is a giant magnetoresistance layer and is situated in at least one depression of the carrier on the insulating layer;
   an integrated circuit on the semiconductor substrate; and
   at least one conducting connection between the integrated circuit and the metallic multiple layer, situated below the metallic multiple layer;
   wherein a contacting of the metallic multiple layer to the conducting connection is implemented through an opening in the insulating layer.

2. The giant magnetoresistance structure as recited in claim 1, further comprising:
   at least one passivating layer positioned on the patterned metallic multiple layer.

* * * * *